United States Patent
Kranz

(10) Patent No.: US 6,933,872 B2
(45) Date of Patent: Aug. 23, 2005

(54) DIGITAL/ANALOG CONVERTER CIRCUIT WITH A DEVICE FOR COMPENSATING NONLINEAR DISTORTIONS

(75) Inventor: Christian Kranz, Ratigen Lintorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/844,022

(22) Filed: May 12, 2004

(65) Prior Publication Data
US 2004/0222907 A1 Nov. 11, 2004

Related U.S. Application Data

(63) Continuation of application No. PCT/DE02/03174, filed on Aug. 29, 2002.

(30) Foreign Application Priority Data
Nov. 12, 2001 (DE) .......................................... 101 55 426

(51) Int. Cl.[7] .............................................. H03M 1/66
(52) U.S. Cl. ...................................... 341/144; 341/143
(58) Field of Search ................................ 341/144, 143, 341/141, 152

(56) References Cited

U.S. PATENT DOCUMENTS

| | | | |
|---|---|---|---|
| 5,548,286 A | | 8/1996 | Craven ........................ 341/126 |
| 5,959,501 A | * | 9/1999 | Chester ....................... 330/251 |
| 6,232,899 B1 | | 5/2001 | Craven ........................ 341/126 |
| 6,304,200 B1 | * | 10/2001 | Masuda ....................... 341/144 |

FOREIGN PATENT DOCUMENTS

| | | | |
|---|---|---|---|
| EP | 0 982 865 A2 | 8/1999 | ............ H03M/1/72 |
| WO | WO 95/06980 | 3/1995 | ............ H03M/1/06 |
| WO | WO 97/37433 | 10/1997 | ............ H03M/5/08 |

OTHER PUBLICATIONS

J.M. Goldberg, et al.; "Pseudo–Natural Pulse Width Modulation for High Accuracy Digital–to–Analogue Conversion"; Electronics Letters, IEE Stevenage, GB, vol. 27, No. 16, pp. 1491–1492, Aug. 1, 1991.

J.M. Goldberg, et al.; "New High Accuracy Pulse Width Modulation Based Digital–To–Analogue Converter/Power Amplifier"; IEE :Proc.–Circuits Devices Syst., vol. 141, No. 4, pps. 315–324, Aug. 1994.

K.M. Smith et al.; "A New PWM Controller with One–Cycle Response", in IEEE Transactions on Power Electronics, vol. 14, No. 1, pps. 142–150, Jan. 1999.

J.S. Chang et al.; "A Novel Low–Power Low–Voltage Class D Amplifier with Feedback for Improving THD, Power Efficiency and Gain Linearity"; International Symposium on Circuits and Systems, Sydney, Australia, pps. 635–638, May 2001.

* cited by examiner

Primary Examiner—Peguy Jeanpierre
Assistant Examiner—Joseph Lauture
(74) Attorney, Agent, or Firm—Baker Botts L.L.P.

(57) ABSTRACT

A digital/analog converter circuit (1) comprises a precompensation stage (10), a PCM/PWM converter stage (7) and a digital/analog converter stage (8), these components being arranged in the signal path in the stated order. The transfer function of the precompensation stage (10) is designed such that the analog output signal (19) is essentially proportional to the digital PCM input signal (11).

18 Claims, 1 Drawing Sheet

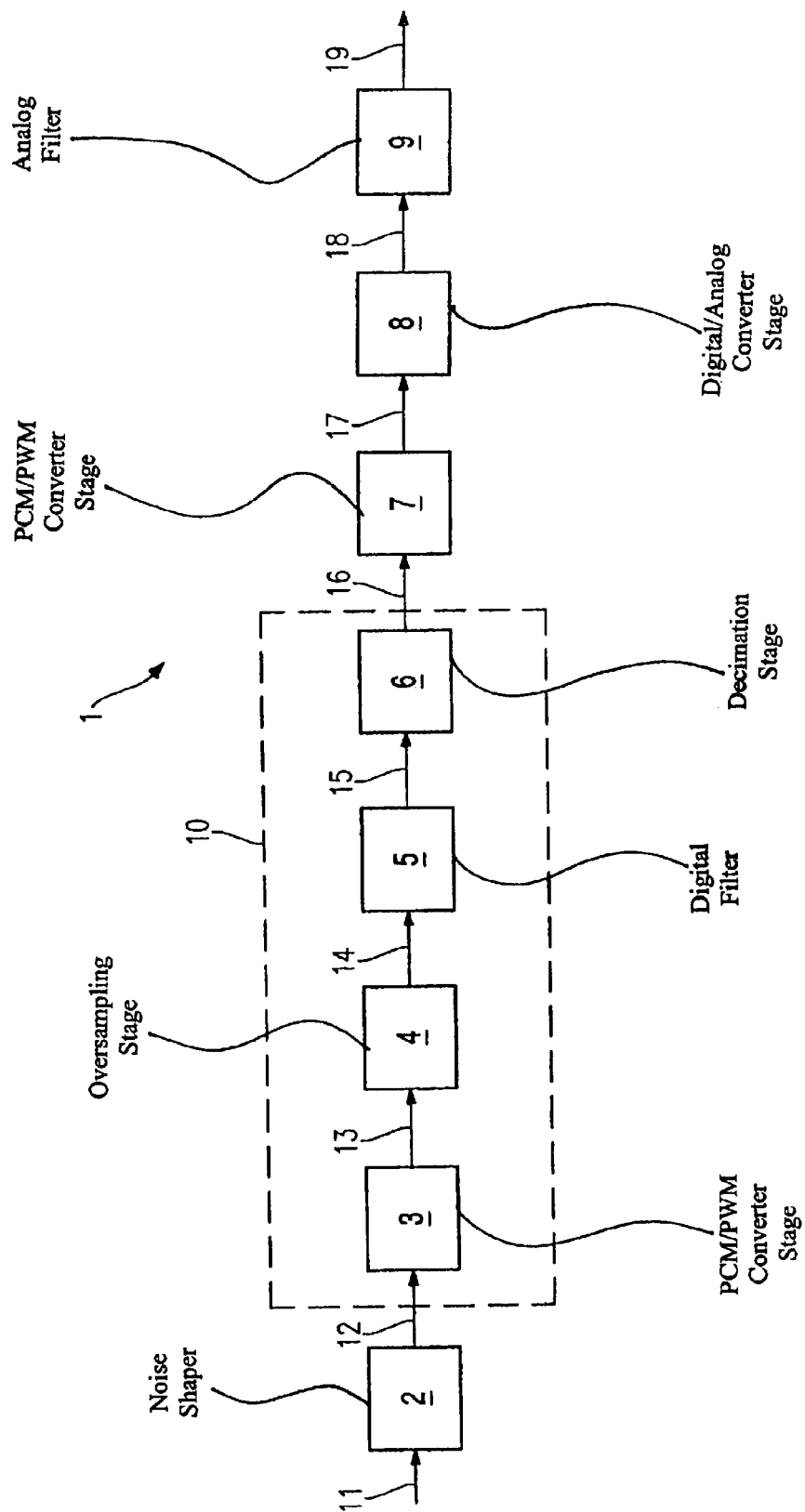

DIGITAL/ANALOG CONVERTER CIRCUIT WITH A DEVICE FOR COMPENSATING NONLINEAR DISTORTIONS

CROSS REFERENCE TO RELATED APPLICATION

This application is a continuation of copending International Application No. PCT/DE02/03174 filed Aug. 29, 2002 which designates the United States, and claims priority to German application no. 101 55 426.5 filed Nov. 12, 2001.

TECHNICAL FIELD OF THE INVENTION

The present invention generally relates to a digital/analog converter circuit which can be used to convert digital PCM signals into analog signals without any distortion.

DESCRIPTION OF RELATED ART AND BACKGROUND OF THE INVENTION

In many technical systems, digital signals are converted into analog signals using pulse width modulations. Examples of such systems are engine controllers, calibration circuits, switched mode power supplies, DC voltage converters, digital amplifiers and, in particular, digital audio amplifiers.

In the aforementioned systems, the digital signal is normally available on the input side in the form of a PCM (pulse code modulated) signal and is first of all converted into a digital PWM (pulse width modulated) signal. Next, the digital PWM signal is converted into an analog signal. Both the PCM/PWM conversion and the conversion of the PWM signal into the analog signal may experience nonlinear distortions. However, PCM/PWM conversion can be performed without losses, in principle, on account of the digital signal processing, i.e. the original PCM signal could be generated from the PWM signal by an inverted conversion without loss of information. In contrast, nonlinear distortions inevitably arise when converting the digital PWM signal into the analog signal. These distortions are caused primarily by the "memory" of the analog area of the circuit in question. The relatively long decay times for the analog "memory", which normally go beyond the length of time of a PWM period, cause decaying square-wave responses from the past to be overlayed with the current square-wave response. Since the square-wave responses from the past are dependent on the pulse width of the digital PWM signal, and these are in turn dependent on the PCM signal, the distortions are nonlinear.

Such "memory" properties of an analog circuit are system inherent and cannot be eliminated completely. For this reason, ways are sought to minimize or even to compensate for the nonlinear distortions arising in the digital/analog conversion through additional digital or analog circuits.

The international patent application WO 97/37433 A1, representing the closest prior art, describes a digital/analog converter circuit which operates according to the above principle and in which the signal path contains a nonlinear Hammerstein filter upstream of the PCM/PWM converter stage. The Hammerstein filter is a precompensation stage which subjects the PCM signal to nonlinear distortion which is the inverse of the nonlinear distortion arising during the PCM/PWM conversion, which means that a distortion free digital PWM signal is obtained overall. A drawback of this digital/analog converter circuit is that it is designed exclusively for UPWM (uniform sampling pulse width modulated) signals. In the case of UPWM signals, the value of the pulse width is always stipulated at the start of the PWM period. PWM signals whose pulse width is determined during the PWM period, so-called PNPWM (pseudo natural pulse width modulation) signals, cannot be generated using the present circuit.

The international patent application WO 95/06980 A1 demonstrates another way of compensating for the nonlinearities which arise during PCM/PWM conversion. To this end, a digital/analog converter circuit has access to a table which is stored in a read only memory. The data stored in the table are used to compensate for the nonlinear distortions.

A relatively complex algorithm for digital compensation for nonlinear distortions by a noise shaper connected upstream of the PCM/PWM converter stage using a specially aligned digital filter in the feedback path is described in the article "New high accuracy pulse width modulation based digital-to-analogue converter/power amplifier" by J. M. Goldberg and M. B. Sandler, which appeared in IEE Proc.-Circuits Devices Syst., volume 141, No. 4, 1994, on pages 315–324.

In addition, analog circuits are known, which minimize nonlinearities via feedback paths. For example the articles "A New PWM Controller with One-Cycle Response" by K. M. Smith, Z. Lai and K. M. Smedley, which appeared in IEEE Transactions on Power Electronics, volume 14, No. 1, 1999, on pages 142–150, and "A Novel Low-power Low-voltage Class D Amplifier with Feedback for Improving THD, Power Efficiency and Gain Linearity" by J. S. Chang, B. H. Gwee, Y. S. Lon and M. T. Tan, which appeared in ISACS 2001, volume 1, on pages 635–638, are concerned with such analog feedback circuits. A drawback of feedback circuits is the instabilities they cause.

SUMMARY OF THE INVENTION

It is an object of the invention to provide a digital/analog converter circuit which has as little distortion as possible. In particular, it is an aim to compensate for the nonlinear distortions caused by the analog area of the circuit. In addition, it is an aim to specify a method which has these properties.

The object on which the invention is based can be achieved by a digital/analog converter circuit for converting a digital PCM input signal into an analog output signal, in which the signal path comprises the following in the stated order:
 a precompensation stage,
 a PCM/PWM converter stage, and
 digital/analog converter stage,
where the transfer function of the precompensation stage is designed such that the analog output signal is essentially proportional to the digital PCM input signal, and the precompensation stage comprises the following components, which are arranged in the signal path in the stated order:
 a further PCM/PWM converter stage,
 an oversampling stage, and
 a digital filter.

The precompensation stage can be designed such that it operates, at least to some extent at a higher signal rate than the signal rate of the digital PCM input signal. The precompensation stage may comprise a decimation stage which is arranged in the signal path downstream of the digital filter. The transfer function of the digital filter can be set such or has been set such that the analog output signal is essentially proportional to the digital PCM input signal. The transfer function of the digital filter can be designed as a low pass filter function. The precompensation stage may have a noise shaper connected upstream/downstream of the digital/analog converter circuit. The digital/analog converter stage may have an analog filter connected downstream of the digital/analog converter circuit. The digital filter can be a recursive wave digital filter or an FIR filter. The digital/analog converter stage can be a circuit breaker. The digital/analog converter circuit can be contained in an audio amplifier, particularly in an audio class D amplifier.

The object can also be achieved by a method for converting a digital PCM input signal into an analog output signal, comprising the steps of:
precompensating the digital PCM input signal;
converting the digital, precompensated PCM signal into a digital PWM signal; and
converting the digital PWM signal into the analog output signal;
wherein precompensating the digital PCM input signal causes the analog output signal to be essentially proportional to the digital PCM input signal, and the precompensation for the digital PCM input signal involves carrying out the steps of:
converting the digital PCM input signal into a digital PWM intermediate signal;
generating a digital PCM intermediate signal by oversampling the digital PWM intermediate signal; and
filtering the digital PCM intermediate signal using a digital filter.

The precompensation for the digital PCM input signal can be performed, at least to some extent, at a higher signal rate than the signal rate of the digital PCM input signal. The precompensation for the digital PCM input signal may involve additionally carrying out the step of reducing the signal rate by reducing the sample that the filter digital PCM intermediate signal using a decimation stage. The transfer function of the digital filter can be set such or may have been set such that the analog output signal is essentially proportional to the digital PCM input signal. The transfer function of the digital filter can be designed as a low pass filter function. The digital PCM input signal prior to precompensation and/or, if appropriate, the digital PCM signal which is output by the decimation stage can be processed by a noise shaper. The analog output signal can be filtered. The digital filter can be a recursive wave digital filter or an FIR filter. The digital PWM signal can be converted into the analog output signal using a circuit breaker. The method can be used in an audio amplifier, particularly in an audio class D amplifier.

The inventive digital/analog converter circuit is used to convert a digital PCM input signal into an analog output signal. To this end, the digital/analog converter circuit comprises, in the signal path, a precompensation stage, a PCM/PWM converter stage connected downstream of the precompensation stage in order to generate a digital PWM signal from the digital, precompensated PCM signal, and a digital/analog converter stage, again connected downstream, on which it is possible to tap off the analog output signal on the output side. A fundamental concept of the invention is that the transfer function of the precompensation stage is designed such that the analog output signal is essentially proportional to the digital PCM input signal.

In the case of the inventive digital/analog converter circuit, the digital PCM input signal is distorted, upon passing through the precompensation stage, such that the nonlinear distortion which arises during the subsequent PCM/PWM and digital/analog conversion operations is compensated for in the analog output signal. This results in an analog output signal which is proportional to the digital PCM input signal. An advantage of the inventive precompensation is that the nonlinear distortions caused by the analog area of the circuit are taken into account in the precompensation.

The inventive digital/analog converter circuit can be used to generate all kinds of pulse width modulated signals; it is not limited to UPWM signals, as is the circuit described in the printed document WO 97/37433 A1. A further advantage over the cited circuit is the inventive use of a simple, for example linear, digital filter instead of a complex nonlinear Hammerstein filter.

In addition, the inventive digital/analog converter circuit does not require a feedback loop, as is needed in many conventional digital/analog converter circuits. Doing without a feedback loop results in greater stability for the inventive digital/analog converter circuit.

Advantageously, the precompensation stage operates, at least to some extent, at a higher signal rate than the signal rate of the digital PCM input signal. The higher signal rate allows the analog circuit areas to be simulated in real time, and therefore allows the nonlinear distortions generated by the analog circuit areas to be ascertained. The digital PCM input signal can then be subjected to the inverse distortions so as to compensate for the distortions. In contrast, conventional digital/analog converter circuits, some of which also have a precompensation stage, do not increase the signal rate in this manner. Instead, these circuits retain the signal rate of the PCM input signal. To be able to calculate the nonlinear distortions arising during the PCM/PWM conversion in advance nevertheless, very complex circuits are required.

The precompensation stage advantageously contains a further PCM/PWM converter stage, an oversampling stage, a digital filter and a decimation stage. In this case, the precompensation stage's components listed above are arranged in the signal path in the stated order. With this configuration of the precompensation stage, the digital PCM input signal is first of all converted into a digital PWM intermediate signal. The oversampling stage takes the digital PWM intermediate signal and generates a digital PCM intermediate signal which has a higher signal rate than the digital PCM input signal. The digital PCM intermediate signal is then supplied to the digital filter. Next, the signal rate of the filtered PCM intermediate signal is reduced again using the decimation stage. The increased signal rate makes it possible to approximate the influence of the analog circuit areas and hence to eliminate it overall.

In line with one particularly advantageous configuration of the invention, the transfer function of the digital filter can be set such or has been set such that nonlinear distortions arising are compensated for by inverse distortions. It is conceivable for this end to be served by virtue of the filter coefficients being preset by the manufacturer and being aligned with the analog environment of the digital/analog converter circuit. Alternatively, provision could be made for the filter coefficients to be set by the user of the digital/analog converter circuit. This would allow balancing of the circuit in the final product. When used in an audio amplifier, the loudspeakers used could be taken into account in this balancing, for example.

It is likewise possible to design the digital/analog converter circuit for universal use. To this end, the transfer function chosen for the digital filter is advantageously a low pass filter function which, when using an additional analog filter, can also be tuned to the latter. This measure allows a large amount of compensation for the nonlinearities which arise, without needing to take into account the exact analog circuit environment of the digital/analog converter circuit.

It is also advantageous to connect a noise shaper upstream and/or downstream of the precompensation stage. The noise shaper reduces the quantization noise in a particular frequency band, for example in the audio frequency band.

The analog output signal can advantageously be filtered using an analog filter. This measure allows the pulsed analog output signal to be given a desired shape.

Possible configurations for the digital filter are, by way of example, recursive wave digital filters or FIR (finite impulse response) filters. The digital/analog converter stage can be in the form of a circuit breaker, for example.

The inventive digital/analog converter circuit can be integrated particularly advantageously into audio amplifiers, particularly into audio class D amplifiers.

The inventive method involves first of all precompensating for a digital PCM input signal. The digital, precompensated PCM signal is converted into a digital PWM signal. Next, the digital PWM signal is converted into an analog output signal. With this method, the effect of the precompensation is that the analog output signal is essentially proportional to the digital PCM input signal.

The inventive method allows the digital PCM input signal to be converted into the analog output signal without the analog output signal being subject to nonlinear distortions which are generated in the analog circuit area through delayed signal drops. This is achieved by the precompensation operation, by virtue of the digital PCM input signal being subjected, by way of example, to a nonlinearity which behaves inversely with respect to the nonlinearity caused by the subsequent digital/analog conversion.

BRIEF DESCRIPTION OF THE DRAWING

The invention is explained in more detail below by way of example with reference to the drawing, where the single FIGURE shows a schematic block diagram of an exemplary embodiment of the inventive digital/analog converter circuit.

DETAILED DESCRIPTION OF EMBODIMENTS

The FIGURE shows the block diagram of a digital/analog converter circuit 1, where the signal path contains a noise shaper 2, a PCM/PWM converter stage 3, an oversampling stage 4, a digital filter 5, a decimation stage 6, a PCM/PWM converter stage 7, a digital/analog converter stage 8 and an analog filter 9 in the stated order. The PCM/PWM converter stage 3, the oversampling stage 4, the digital filter 5 and the decimation stage 6 together form a precompensation stage 10. A digital PCM signal 11 is fed into the input side of the noise shaper 2. Next, the PCM signal 12 which is output from the noise shaper 2 is converted into a digital PWM signal 13. The signal rate is increased using the oversampling stage 4. The resultant PCM signal 14 is filtered using the digital filter 5. The signal rate of the filtered PCM signal 15 is reduced again by the decimation stage 6. The digital PCM signal 16 has nonlinear distortions with respect to the digital PCM signal 11 on account of the digital filtering. The digital PCM signal 16 is then transformed into a digital PWM signal 17, and this signal is converted into an analog signal 18 in the digital/analog converter stage 8. Finally, the analog signal 18 is filtered, so that the output signal obtained from the digital/analog converter circuit 1 is a filtered analog signal 19.

The nonlinear distortion in the PCM signal 15, which is brought about by the digital filter 5, is carried along as far as the digital/analog converter stage 8 by the respective digital signals. The digital/analog conversion subjects the resultant analog signal 18 to a further nonlinear distortion, for example coming from "memory" properties of the analog circuit areas. The transfer function of the digital filter 5 is chosen such that the nonlinear distortion it brings about behaves inversely with respect to the distortion which arises during the digital/analog conversion. In this case, by way of example, it is also possible to take into account distortions which are generated by further analog circuit elements, such as the analog filter 9 or a loudspeaker which may be connected downstream. The result obtained is distortion-free analog signals 18 and/or 19.

What is claimed is:

1. A digital/analog converter circuit for converting a digital PCM input signal into an analog output signal, in which the signal path comprises the following in the stated order:

a precompensation stage for the digital PCM input signal operating, at least to some extent, at a higher signal rate than the signal rate of the digital PCM input signal, a PCM/PWM converter stage, and digital/analog converter stage, wherein a transfer function of the precompensation stage is designed such that the analog output signal is essentially proportional to the digital PCM input signal, and the precompensation stage comprises the following components, which are arranged in the signal path in the stated order:

a further PCM/PWM converter stage, an oversampling stage, and a digital filter.

2. The digital/analog converter circuit as claimed in claim 1, wherein the precompensation stage comprises a decimation stage which is arranged in the signal path downstream of the digital filter.

3. The digital/analog converter circuit as claimed in claim 2, wherein the transfer function of the digital filter can be set such or has been set such that the analog output signal is essentially proportional to the digital PCM input signal.

4. The digital/analog converter circuit as claimed in claim 2, wherein the transfer function of the digital filter is designed as a low pass filter function.

5. The digital/analog converter circuit as claimed in claim 2, wherein the digital filter is a recursive wave digital filter or an FIR filter.

6. The digital/analog converter circuit as claimed in claim 1, wherein the precompensation stage has a noise shaper connected to the digital/analog converter circuit.

7. The digital/analog converter circuit as claimed in claim 1, wherein the digital/analog converter stage has an analog filter connected downstream of the digital/analog converter circuit.

8. The digital/analog converter circuit as claimed in claim 1, wherein the digital/analog converter stage is a circuit breaker.

9. The digital/analog converter circuit as claimed in claim 1, wherein the digital/analog converter circuit is contained in an audio amplifier, particularly in an audio class D amplifier.

10. A method for converting a digital PCM input signal into an analog output signal, said method comprising:

precompensating the digital PCM input signal;

converting the digital, precompensated PCM signal into a digital PWM signal; and converting the digital PWM signal into the analog output signal;

wherein precompensating the digital PCM input signal is performed, at least to some extent, at a higher signal rate than the signal rate of the digital PCM input signal, and precompensating the digital PCM input signal causes the analog output signal to be essentially proportional to the digital PCM input signal, and the precompensation for the digital PCM input signal involves carrying out the steps of:

converting the digital PCM input signal into a digital PWM intermediate signal;

generating a digital PCM intermediate signal by oversampling the digital PWM intermediate signal; and filtering the digital PCM intermediate signal using a digital filter.

11. The method as claimed in claim 10, wherein the transfer function of the digital filter is set such or has been set such that the analog output signal is essentially proportional to the digital PCM input signal.

12. The method as claimed in claim 10, wherein the transfer function of the digital filter is designed as a low pass filter function.

13. The method as claimed in claim 10, wherein the digital PCM input signal prior to precompensation and/or, if appropriate, the digital PCM signal which is output by the decimation stage is processed by a noise shaper.

14. The method as claimed in claim 10, wherein the analog output signal is filtered.

15. The method as claimed in claim 10, wherein the digital filter is a recursive wave digital filter or an FIR filter.

16. The method as claimed in claim 10, wherein the digital PWM signal is converted into the analog output signal using a circuit breaker.

17. The method as claimed in claim 10, wherein the method is used in an audio class D amplifier.

18. A method for converting a digital PCM input signal into an analog output signal, said method comprising:

precompensating the digital PCM input signal;

converting the digital precompensated PCM signal into a digital PWM signal; and converting the digital PWM signal into the analog output signal, precompensating the digital PCM input signal causing the analog output signal to be essentially proportional to the digital PCM input signal, the precompensation for the digital PCM input signal involving the steps:

converting the digital PCM input signal into a digital PWM intermediate signal;

generating a digital PCM intermediate signal by oversampling the digital PWM intermediate signal; and filtering the digital PCM intermediate signal using a digital filter, wherein the method is used in an audio class D amplifier.

* * * * *